(12) United States Patent
Schmidhammer

(10) Patent No.: US 9,391,587 B2
(45) Date of Patent: Jul. 12, 2016

(54) COMPONENT WITH FIRST AND SECOND DUPLEXERS

(71) Applicant: EPCOS AG, Munich (DE)

(72) Inventor: Edgar Schmidhammer, Stein an der Traun (IT)

(73) Assignee: EPCOS AG, Munich (DE)

( * ) Notice: Subject to any disclaimer, the term of this patent is extended or adjusted under 35 U.S.C. 154(b) by 737 days.

(21) Appl. No.: 13/631,836

(22) Filed: Sep. 28, 2012

(65) Prior Publication Data

US 2013/0082796 A1 Apr. 4, 2013

(30) Foreign Application Priority Data

Sep. 30, 2011 (DE) .......................... 10 2011 114 642

(51) Int. Cl.

| | | |
|---|---|---|
| *H03H 9/70* | (2006.01) | |
| *H01P 5/16* | (2006.01) | |
| *H01P 5/19* | (2006.01) | |
| *H03H 9/05* | (2006.01) | |
| *H01P 5/22* | (2006.01) | |
| *H03H 9/54* | (2006.01) | |

(52) U.S. Cl.
CPC .............. *H03H 9/0566* (2013.01); *H01P 5/16* (2013.01); *H01P 5/227* (2013.01); *H03H 9/70* (2013.01); *H03H 9/0547* (2013.01); *H03H 9/542* (2013.01)

(58) Field of Classification Search
CPC .............. H01P 5/12; H01P 5/10; H01P 5/16; H01P 5/19; H01P 5/227; H03H 9/0571; H03H 9/0566; H03H 2009/0019; H03H 9/0023; H03H 9/0028; H03H 9/0095; H03H 9/0538; H03H 9/5042; H03H 9/0547; H03H 9/0557; H03H 9/0661; H03H 9/0576; H03H 9/465; H03H 9/542; H03H 9/70; H03H 9/706; H03H 9/725
USPC .................................. 333/117, 118, 120, 133
See application file for complete search history.

(56) References Cited

U.S. PATENT DOCUMENTS

| | | | | |
|---|---|---|---|---|
| 5,382,925 | A * | 1/1995 | Hayashi | ................... H03H 7/48 333/112 |
| 6,380,823 | B1 * | 4/2002 | Ikata | .................... H03H 9/0576 333/133 |
| 2004/0257172 | A1 * | 12/2004 | Schmidhammer | ... H03H 9/0038 333/133 |
| 2006/0189292 | A1 | 8/2006 | Ueda et al. | |
| 2007/0015468 | A1 * | 1/2007 | Kouki | .................... H04B 1/525 455/63.1 |
| 2008/0174501 | A1 * | 7/2008 | Licul | ...................... H01Q 11/08 343/703 |
| 2009/0268642 | A1 | 10/2009 | Knox | |
| 2010/0135193 | A1 | 6/2010 | Przadka | |
| 2010/0265852 | A1 * | 10/2010 | Tikka | ................... H04B 1/0057 370/278 |
| 2012/0127034 | A1 * | 5/2012 | DiFonzo | .............. H01Q 3/2682 342/375 |
| 2012/0207474 | A1 * | 8/2012 | Inoue | ..................... H04B 10/60 398/65 |

FOREIGN PATENT DOCUMENTS

| | | |
|---|---|---|
| DE | 102007019082 A1 | 10/2008 |
| DE | 102010046677 A1 | 3/2012 |

\* cited by examiner

*Primary Examiner* — Barbara Summons

(74) *Attorney, Agent, or Firm* — McDermott Will & Emery LLP

(57) ABSTRACT

The present invention relates to a component (BE) which has a first duplexer operating with acoustic waves and a second duplexer operating with acoustic waves, wherein the first and second duplexers are arranged in a single SMD housing. In addition, the invention relates to a module (MO), which interconnects such a component (BE) and at least three 90° hybrids (HYB1-HYB3) to form an enhanced duplexer. A further aspect of the invention relates to a 2in1 hybrid, in which two 90° hybrids (HYB3, HYB4) or one 90° hybrid (HYB3) and one 180° hybrid (BAL) are arranged on a single chip.

13 Claims, 9 Drawing Sheets

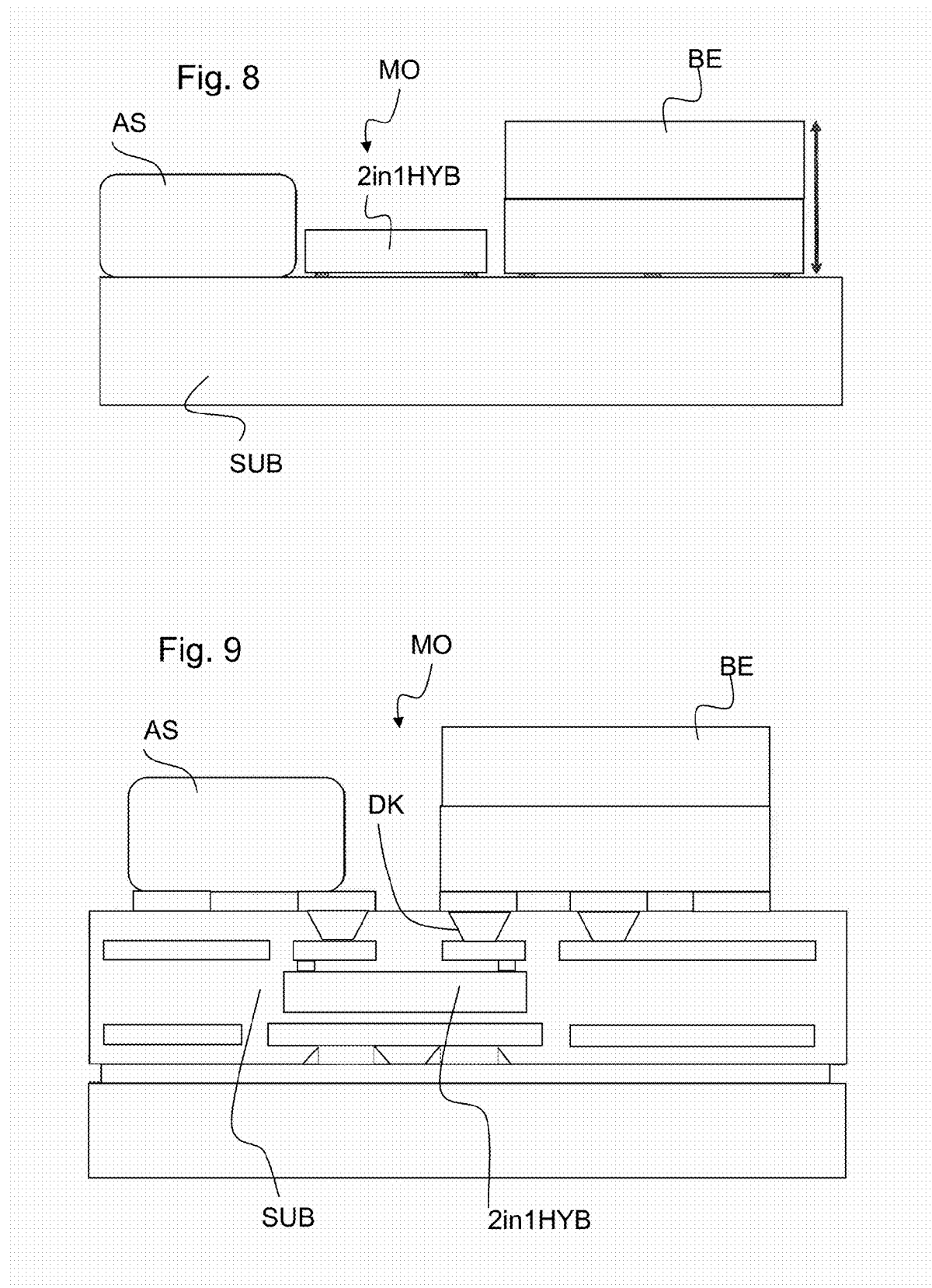

COMPONENT WITH FIRST AND SECOND DUPLEXERS

Figure 1:
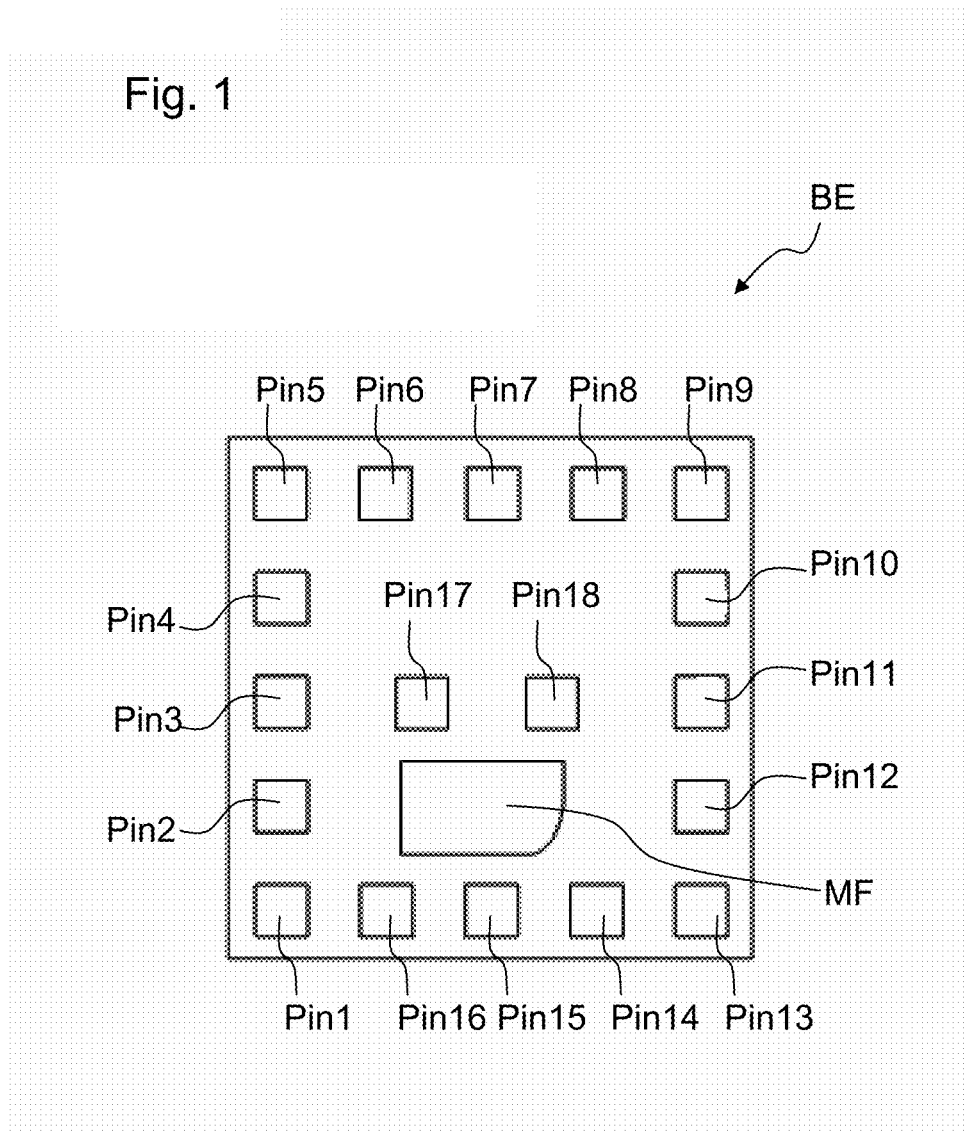

The invention relates to a component having two duplexers operating with acoustic waves. In addition, the invention relates to a module having an antenna connection, a transmission connection and a reception connection. Furthermore, the invention relates to a chip.

US 2009/0268642 A1 describes a circuit arrangement in which duplexers and 90° hybrids are connected to one another and are connected to an antenna, transmission and reception connection. The antenna, transmission and reception connections and the duplexers all have an unbalanced configuration. Correspondingly, the circuit is only suitable for applications which process purely unbalanced signals. In particular, the circuit is not suitable for mobile radio since in this case reception filters and reception connections often have a balanced configuration. Extending the circuit to balanced components is not readily possible either since otherwise a complicated and non-symmetrical line routing would be unavoidable.

One of the objects of the present invention is therefore to provide components which make it possible to simplify the circuit arrangement.

This object is achieved by a component having the features of claim 1. A further independent claim proposes a module, in which a correspondingly simplified circuit arrangement is implemented. In addition, a further independent claim proposes a chip, which likewise makes it possible to simplify the circuit arrangement. Advantageous configurations of the invention result from the further claims.

A component is proposed which has a first duplexer operating with acoustic waves and a second duplexer operating with acoustic waves, wherein the first duplexer and the second duplexer are arranged in a single SMD (surface mounted device) housing. The first and the second duplexer can be either SAW (surface acoustic wave) duplexers or BAW (bulk acoustic wave) duplexers. It is possible both for the two duplexers to be manufactured using the same technology and for the first and the second duplexer to be manufactured using different technologies. In addition, at least one of the two duplexers can be a hybrid duplexer, which has a SAW filter and a BAW filter.

The arrangement of the two duplexers in a single SMD housing makes it possible to simplify the conductor track routing in the case of relatively complex modules with a plurality of duplexers. In addition, it is possible to arrange more than two duplexers in a single SMD housing and to interconnect said duplexers to form a so-called Nin1 duplexer.

If the two duplexers are manufactured using the same technology on one chip, any manufacturing tolerances are compensated for on the two duplexers, with the result that the characteristic of the component overall is falsified to a lesser extent owing to the manufacturing tolerances. In particular in the case of a module which has such a component with two duplexers manufactured in the same way, a symmetrical conductor track routing can make it possible to achieve a situation in which error tolerances are not added to one another. The error tolerances instead cancel one another out.

In one exemplary embodiment, the first and the second duplexer have connections, conductor tracks and metallization structures, wherein the first duplexer and the second duplexer have a mirror-symmetrical design with respect to at least one feature, selected from connections, the conductor track routing and the arrangement of the metallization structures.

A mirror-symmetrical component makes it possible to construct a mirror-symmetrical module. Correspondingly, the mirror-symmetrical component provides a possibility of clear conductor track routing and a reduction in the number of conductor track crossovers required.

Each of the two duplexers can have two unbalanced and one balanced connection or three unbalanced connections. In particular in the case of duplexers which use acoustic volume waves, it is advantageous to equip the duplexer with three unbalanced connections.

A further aspect of the present invention proposes a module which has a component having a first and a second duplexer operating with acoustic waves, wherein the first and the second duplexer are arranged in a single SMD housing. In addition, the module has an antenna connection, a transmission connection and a reception connection. In addition, the module has at least three 90° hybrids, which each split an input signal into two output signals, wherein the two output signals have a relative phase shift of 90° with respect to one another, wherein the antenna connection, the transmission connection and the reception connection are each connected to a 90° hybrid, wherein the component and the 90° hybrids are interconnected in such a way that the two output signals which are output by the 90° hybrid connected to the transmission connection interfere constructively at the antenna connection and parasitic signals caused by the two output signals interfere destructively at the reception connection.

It is necessary to consider that the relative phase shift between the two output signals of a 90° hybrid with respect to one another is 90°+Δn. Δn is 0° for an ideal 90° hybrid. Approximately 3° is conventional for Δn in a real 90° hybrid. In the text which follows, the phase shift between the output signals is specified as 90°, wherein a discrepancy of approximately 3° is implicitly possible. Analogously, a slight discrepancy is implicitly also assumed in the case of the phase shift of the output signals of 180° hybrids.

A constructive interference of two signals arises when the two signals are not phase-shifted with respect to one another. A destructive interference arises when the two signals have a phase shift of 180° with respect to one another.

The use of the component in the module enables clear conductor track routing, in which the number of conductor track crossovers is minimized. In particular, the use of a component which is mirror-symmetrical with respect to the arrangement of the connections makes it possible to configure the module to be symmetrical. A symmetrical module demonstrates a good filter characteristic in particular in the high frequency range.

Preferably, at least two of the 90° hybrids are arranged on a single chip. These 90° hybrids arranged on the one chip can be connected in parallel with one another. The use of such a 2in1 hybrid makes it possible to simplify the conductor track routing and to completely avoid conductor track crossovers. A "chip" is in this case intended to mean a unit which is fitted on the module substrate or is arranged within the module substrate. In turn, the chip can have a chip substrate, which preferably has a semiconductor material. The 90° hybrids can be semiconductor circuits which are arranged on a semiconductor chip.

90° hybrids which are connected in parallel with one another can be connected to balanced outputs of the two duplexers of the component.

Preferably, the 90° hybrids arranged on the chip are interconnected with connections of the chip in such a way that a crossover-free conductor track routing results on the module. By virtue of a targeted layout of the chip, unavoidable conductor track crossovers can be moved away from the module onto the chip. In this way, a clear module with a simple design can be implemented.

In one embodiment, the module also has a 180° hybrid, which splits an input signal into two output signals, wherein the two output signals have a relative phase shift of 180° with respect to one another. 180° hybrids are also referred to as baluns. The 180° hybrid can be connected in series with a 90° hybrid. The series connection of a 90° hybrid and a balun makes it possible to convert an unbalanced connection into two balanced signals.

Preferably, the 90° hybrid and the 180° hybrid, which is connected in series therewith, are arranged on a single chip.

Each of the 90° hybrids can be implemented by a multilayered substrate, which has two coil-shaped metallizations in two layers of the substrate. The two metallizations in adjacent layers of the substrate can be coupled to one another. In addition, a termination resistor can be integrated in each 90° hybrid.

In one exemplary embodiment, signals with a first phase angle are output at two connections of the component and signals with a second phase angle are output at two connections of the component. This occurs when at least one connection of each of the two duplexers on the component has a balanced configuration. The connections of the component at which the signals with the first phase angle are present can be connected to one of the 90° hybrids and the connections of the component at which the signals with the second phase angle are present can be connected to another of the 90° hybrids.

A further aspect of the present invention proposes a chip which has a first 90° hybrid which splits an input signal into two output signals, wherein the two output signals have a relative phase shift of 90° with respect to one another, and a second 90° hybrid. Alternatively, the chip can have a first 90° hybrid and a 180° hybrid, which splits an input signal into two output signals, wherein the two output signals have a relative phase shift of 180° with respect to one another. Correspondingly, a 2in1 hybrid on a single chip is proposed. Alternatively, a combination of a 90° hybrid and a balun to form a single component is proposed. Both configurations are not restricted to two hybrids. In the context of the present invention, any desired number of hybrids can be interconnected on one chip to form Nin1 hybrids.

Preferably, the first 90° hybrid and the second 90° hybrid are connected in parallel with one another.

The chip can have a multilayered chip substrate and connections. The first and the second hybrid can be implemented by coil-shaped metallizations in two layers of the multilayered chip substrate, wherein the coil-shaped metallizations are each connected to in each case one connection via a connecting metallization and wherein a connecting metallization of the first 90° hybrid and a connecting metallization of the second 90° hybrid cross over in different layers. In particular, when using a 2in1 hybrid in a module, advantages result by virtue of implementing unavoidable conductor track crossovers in the chip substrate of the 2in1 hybrid such that the conductor track routing on the module can be without any crossovers.

The first 90° hybrid and the 180° hybrid can be connected in series. Such a chip correspondingly has a balanced output and an unbalanced input.

In the text which follows, the invention will be explained in more detail with reference to exemplary embodiments of the associated figures. The figures show various exemplary embodiments of the invention using schematic illustrations which are not true to scale.

Figure 2:
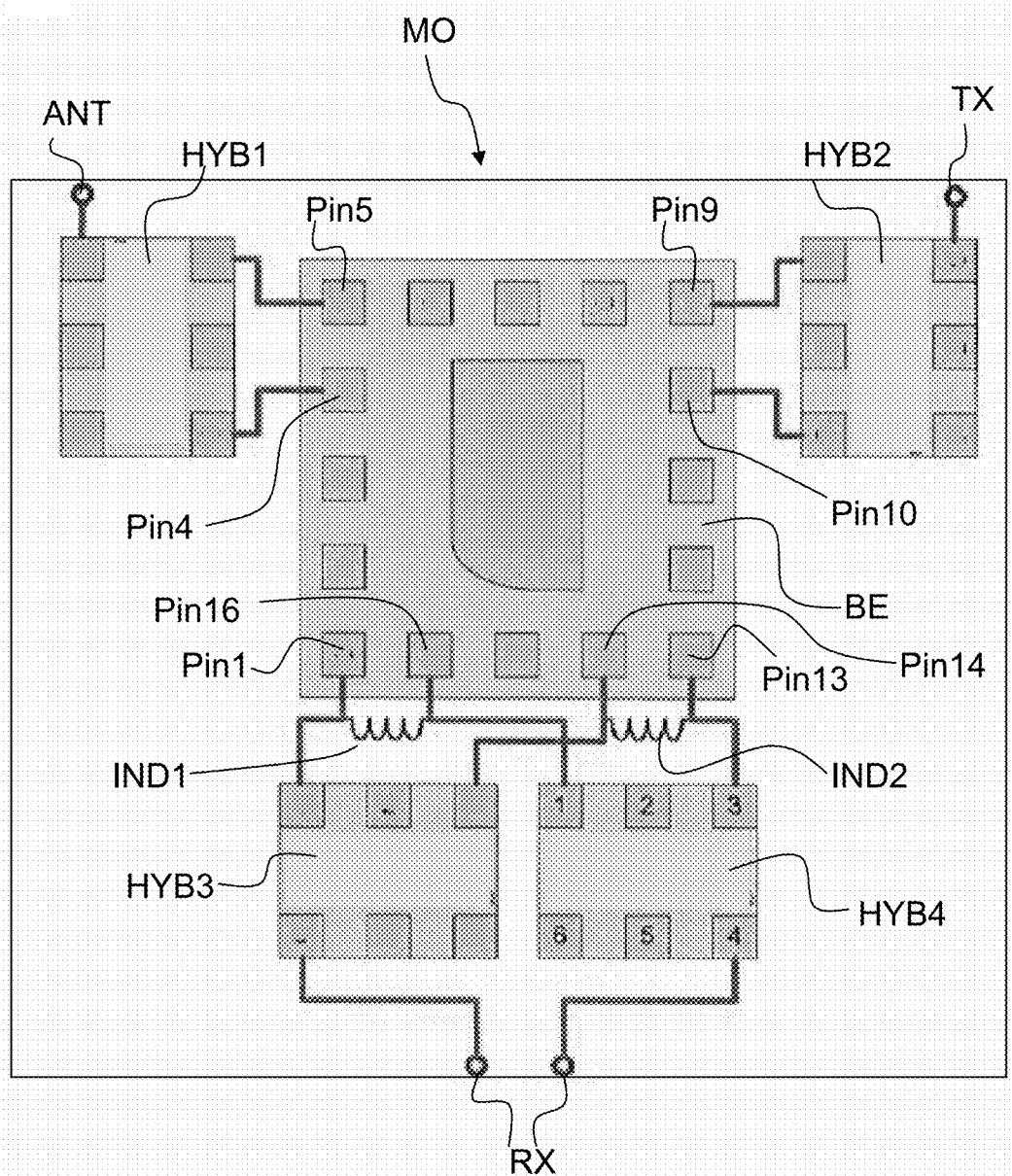
Figure 3:
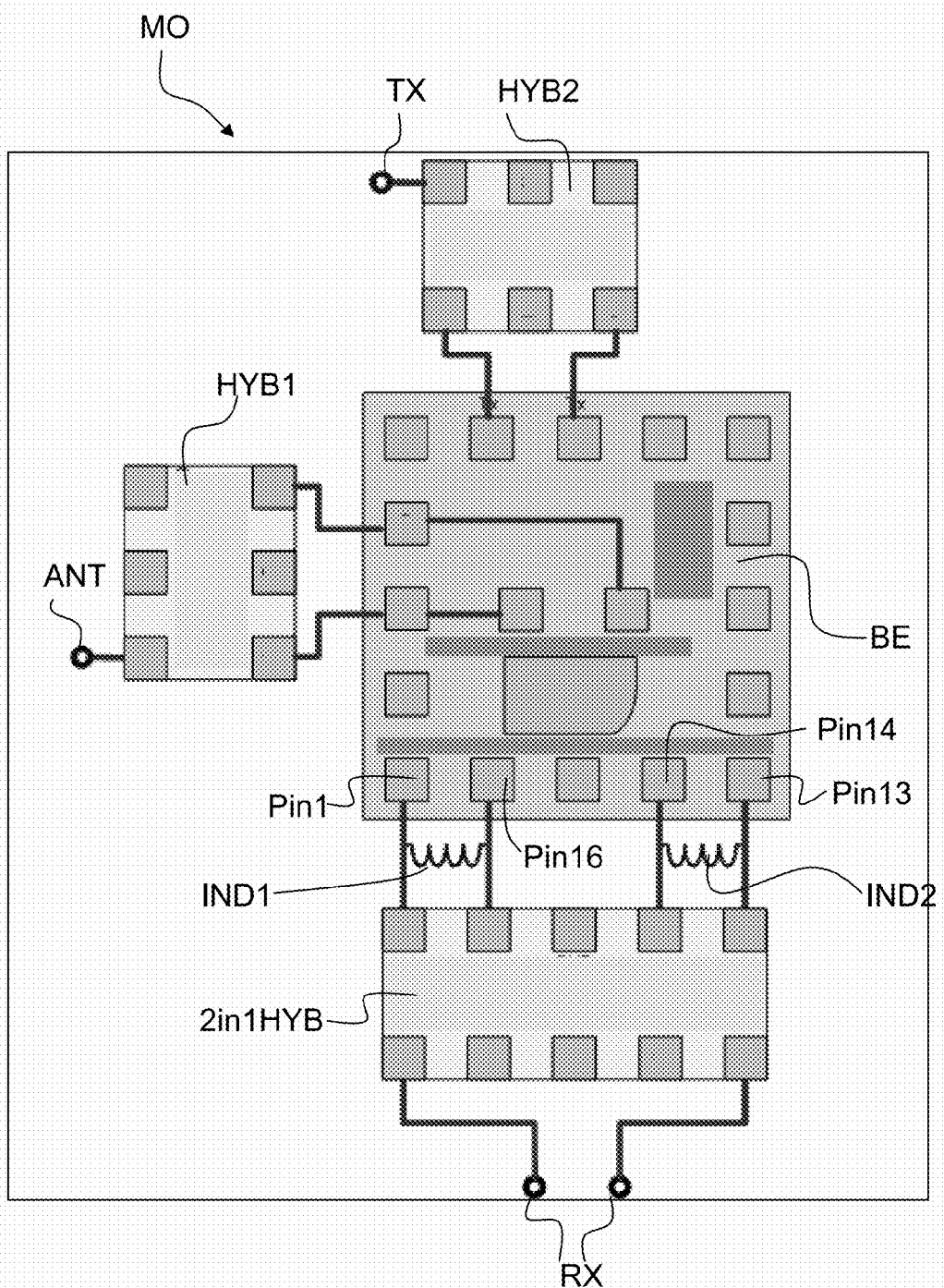
Figure 4:
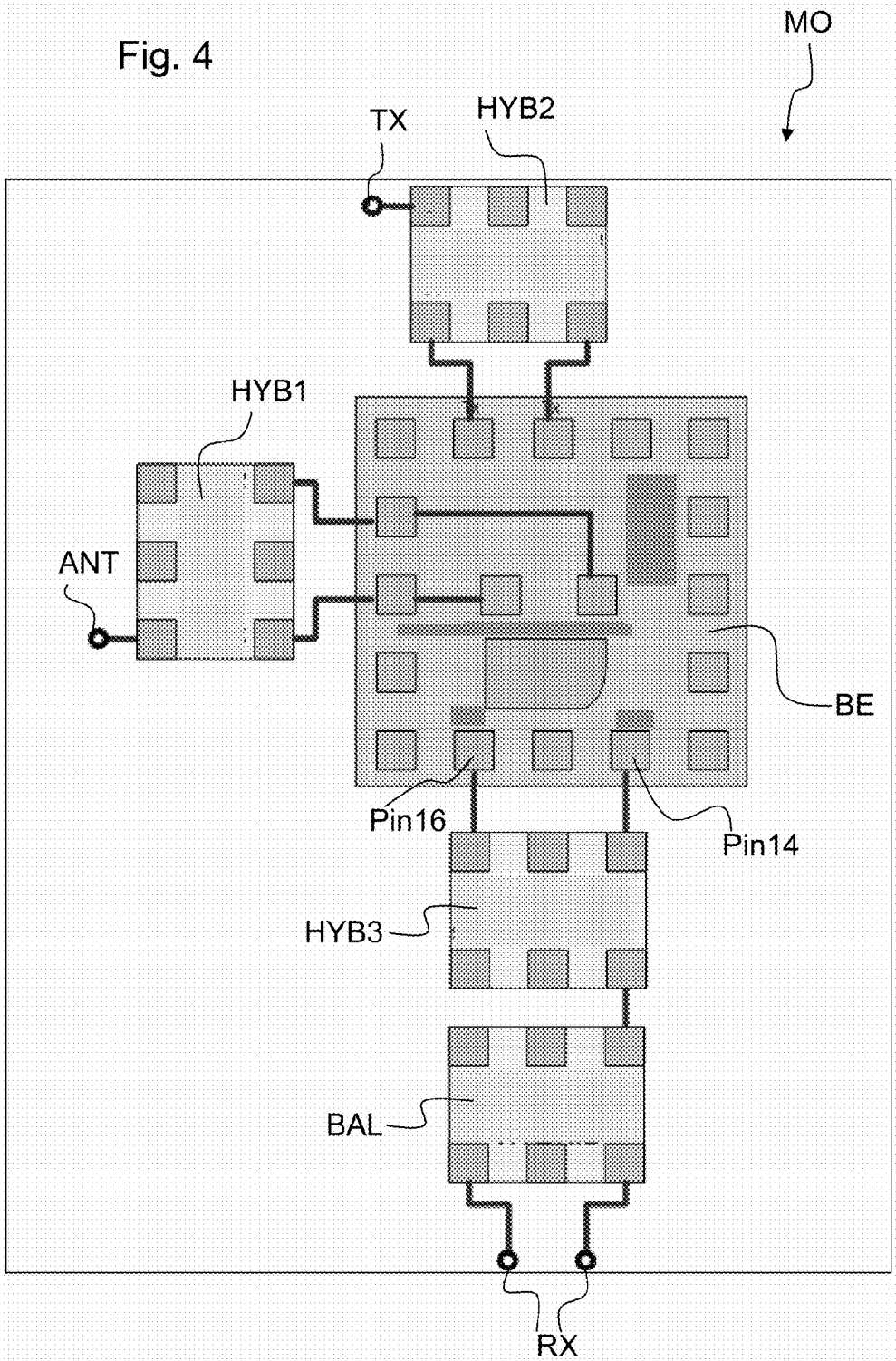
Figure 5:
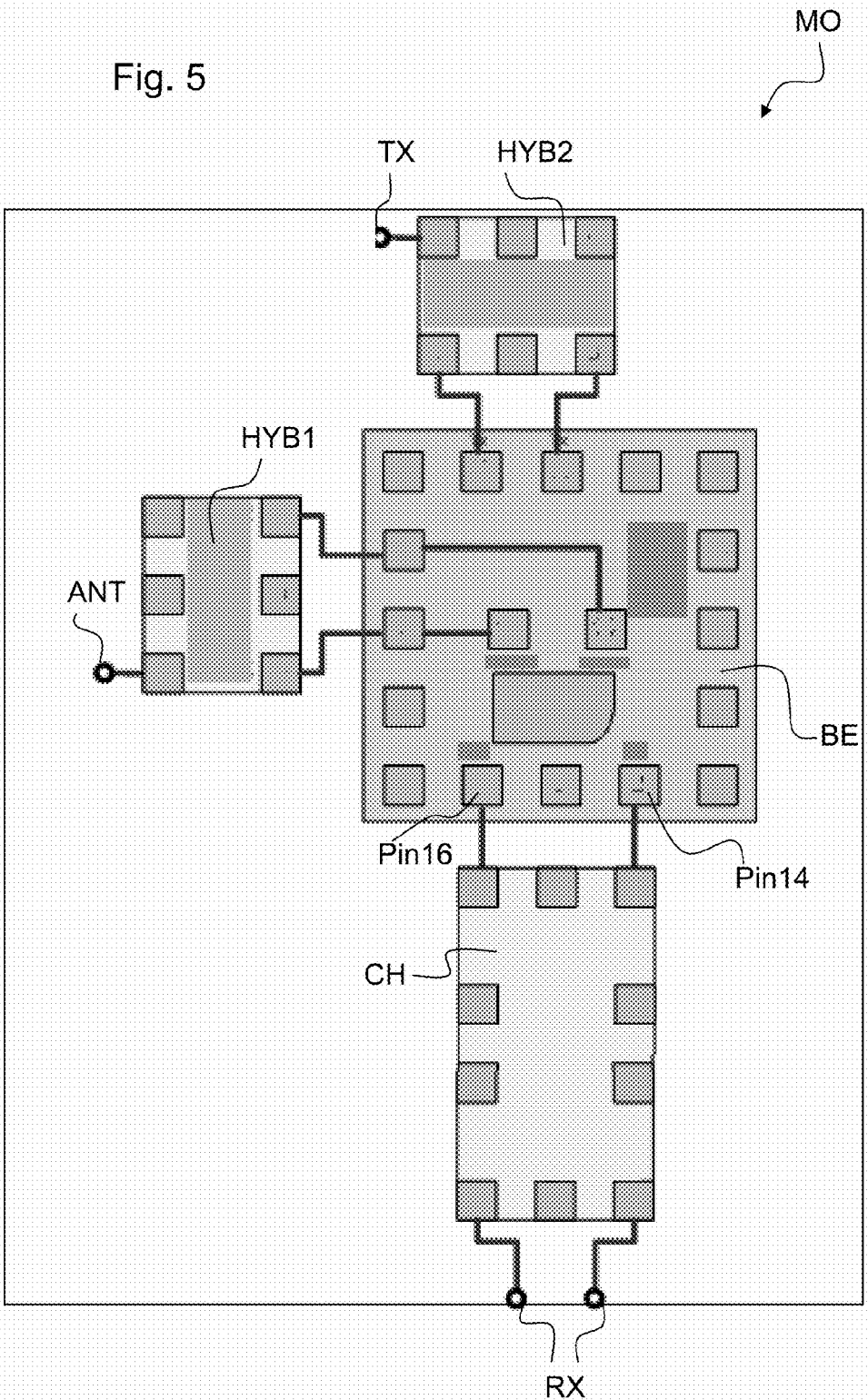
Figure 6:
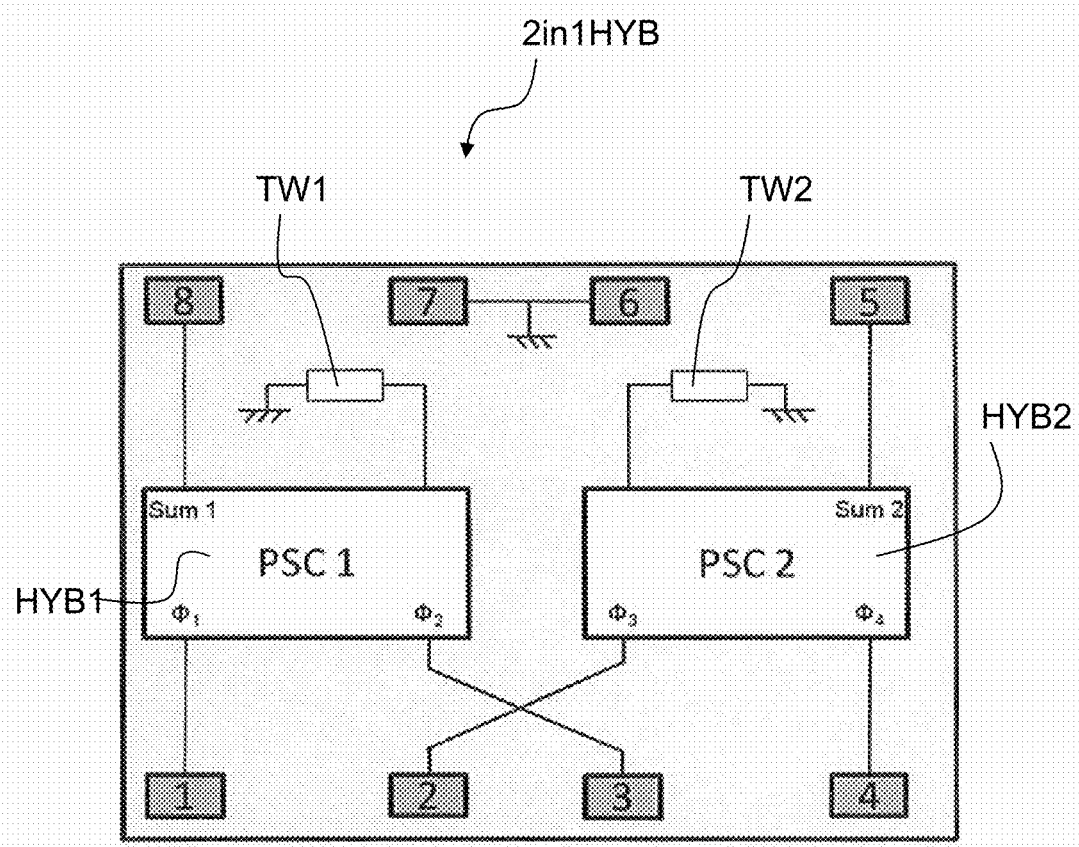
Figure 7:
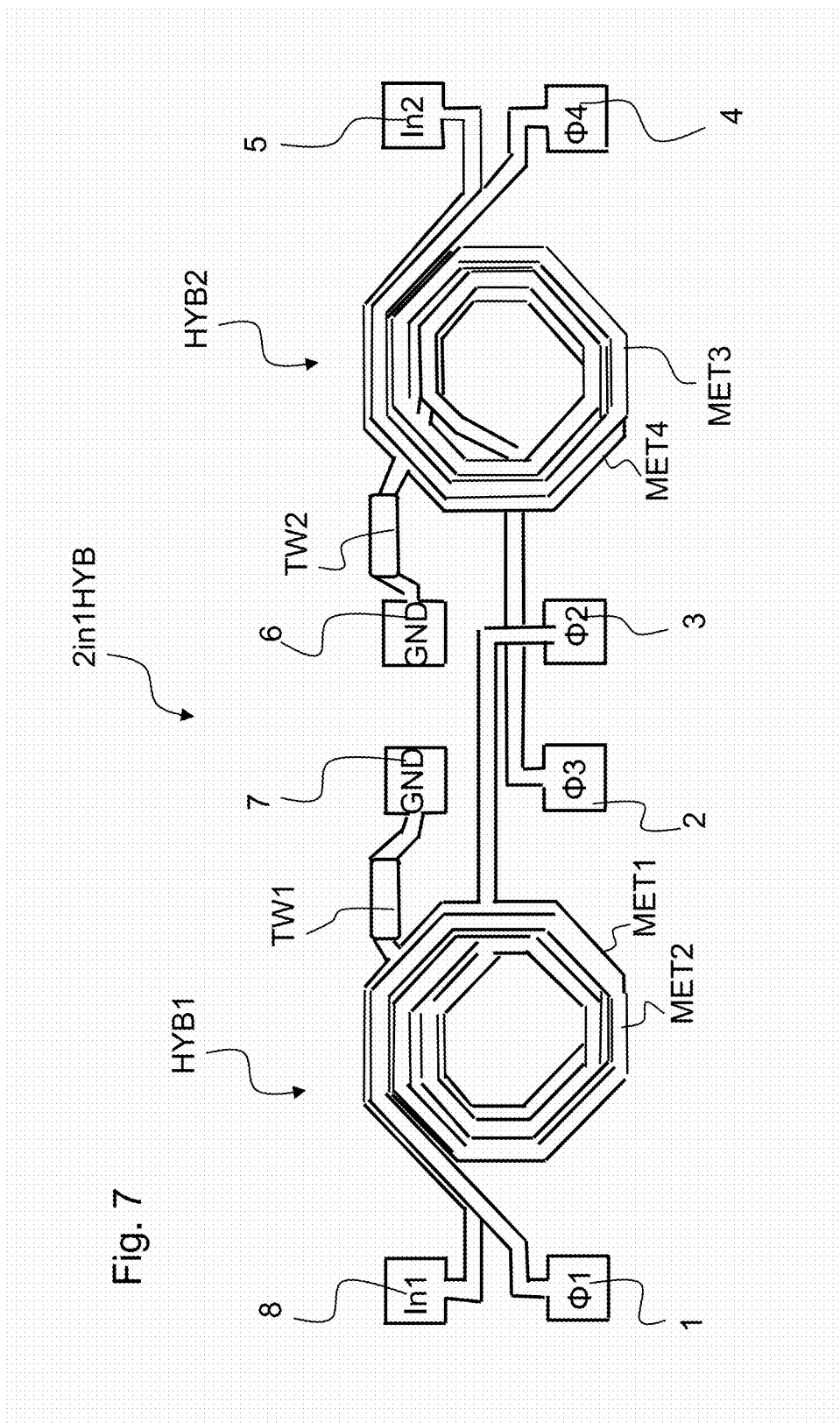
Figure 10:
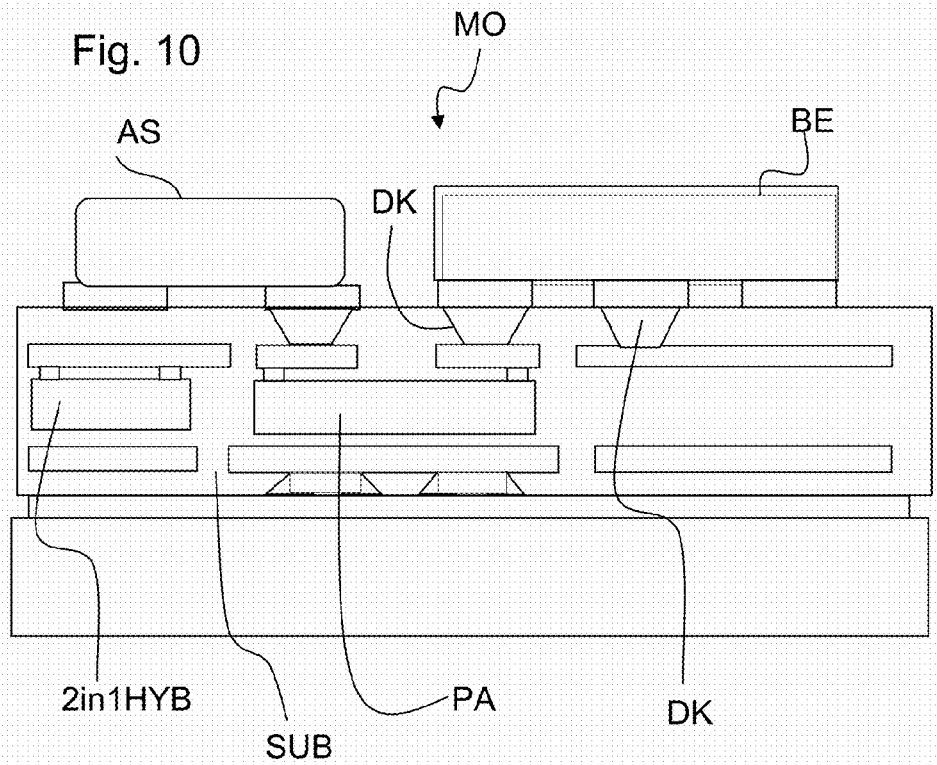
Figure 11:
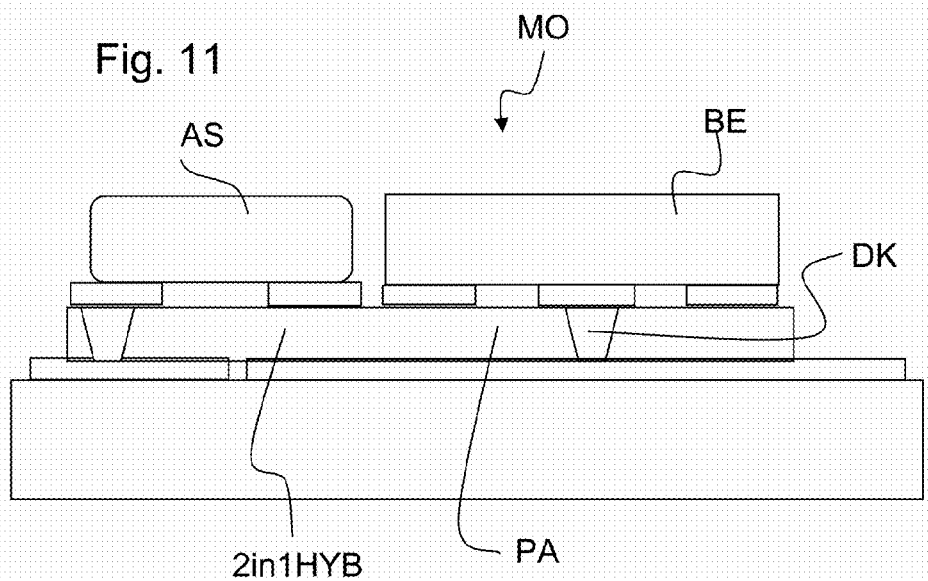

FIG. 1 shows the lower side of a component.
FIG. 2 shows a first embodiment of a module having the component.
FIG. 3 shows a second embodiment of a module having the component.
FIG. 4 shows a third embodiment of a module having the component.
FIG. 5 shows a fifth embodiment of a module having the component.
FIG. 6 shows a chip which forms a 2in1 hybrid.
FIG. 7 shows the implementation of two 90° hybrids in a multilayered chip substrate.
FIG. 8 shows an implementation of the module.
FIG. 9 shows a further implementation of the module.
FIG. 10 shows a further implementation of the module.
FIG. 11 shows a further implementation of the module.

FIG. 1 shows the lower side of a component BE. The component BE is a so-called 2in1 duplexer, i.e. a component BE in which two duplexers are arranged in a single SMD housing. The two duplexers operate with acoustic waves. These may be either two SAW (surface acoustic wave) duplexers, two BAW (bulk acoustic wave) duplexers or one SAW and one BAW duplexer. In addition, a hybrid duplexer is conceivable which has SAW and BAW filters.

The component BE shown in FIG. 1 has a metal area MF and a plurality of connections Pin1-Pin18. The metal area MF forms metallizations for the first and the second duplexer. The metallization MF has a rounded corner. This makes it possible to mark an orientation of the component BE and thus to enable optical inspection of the alignment of the component.

The first and the second duplexer each have two unbalanced connections and one balanced port.

The connections of the two duplexers can be connected in different ways to the connections Pin1-Pin18 of the component BE. An exemplary assignment of the connections is explained below. In this case, the connections Pin1, Pin4, Pin5, Pin9, Pin10, Pin13, Pin14 and Pin16 of the component BE are assigned. In this case, the connections Pin4, Pin10, Pin1 and Pin16 are assigned to the first duplexer. The connections Pin5, Pin9, Pin13 and Pin14 are assigned to the second duplexer. The connections Pin1 and Pin16 of the component BE are connected to in each case one terminal of a balanced port of the first duplexer. The connections Pin13 and Pin14 are connected to in each case one terminal of a balanced port of the second duplexer. The further connections Pin4, Pin5, Pin9 and Pin10 are each unbalanced.

The connections Pin17 and Pin18 are arranged, for example, centrally on the component BE. These connections are optional. They can be connectable to an antenna connection. The arrangement of the connections Pin17 and Pin18 centrally on the component enables symmetrical conductor track routing and overall a high degree of symmetry of the component BE.

The two duplexers arranged on the component BE have connections which are in turn connected to some of the connections Pin1-Pin18 of the component BE. The two duplexers can be identical in respect of the arrangement of their connections, i.e. in respect of to the so-called pinning on the component BE. Alternatively, the two duplexers of the component BE can have a mirror-symmetrical arrangement of their connections. If the two duplexers are manufactured using the same technology, i.e. two BAW duplexers or two SAW duplexers, they can be arranged on a single chip. If the duplexers are one SAW duplexer and one BAW duplexer, each duplexer is manufactured on a separate chip and the two chips are arranged in a single SMD housing. In addition, so-called hybrid duplexers are possible in which a duplexer has a SAW filter and a BAW filter.

A particular advantage of an arrangement of the two duplexers on a single chip is the fact that any manufacturing tolerances on the two duplexers compensate for one another, with the result that owing to this fact alone the filter characteristic of the component BE is markedly improved since the two duplexers are virtually identical as a result of the common manufacture.

FIG. 2 shows a module MO which is a so-called enhanced duplexer. The module MO has an antenna connection ANT, a transmission connection TX and a reception connection RX. The antenna connection ANT and the transmission connection TX are unbalanced. The reception connection RX is balanced.

The antenna connection ANT of the module MO is connectable to an antenna. The reception connection RX is connectable to a reception circuit. The transmission connection TX is connectable to a transmission circuit.

The module MO passes signals which are coupled in at the antenna connection ANT and have frequencies from a reception band of the reception circuit on to the reception connection RX. In addition, the module MO passes transmission signals which are coupled in at the transmission connection TX on to the antenna. The module MO is designed in such a way that the proportion of parasitic signals which are passed on from the transmission connection TX to the reception connection RX is minimized. These signals could otherwise disrupt the reception circuit. The parasitic signals are passed over various paths from the transmission connection TX to the reception connection RX and interfere there destructively.

In addition, the module has four 90° hybrids HYB1, HYB2, HYB3, HYB4 and a component BE, which has a first duplexer operating with acoustic waves and a second duplexer operating with acoustic waves. The first and the second duplexer of the component BE are arranged in a single SMD housing. Correspondingly, the component BE corresponds substantially to the component BE shown in FIG. 1. The component shown in FIG. 2 also does not have any connections (such as Pin17 and Pin18 in FIG. 1) which are arranged centrally on the component BE. In this case, the component BE has the connections Pin1-Pin16. In this case, the connections Pin4, Pin10, Pin1 and Pin16 are assigned to the first duplexer. The connections Pin5, Pin9, Pin13 and Pin14 are assigned to the second duplexer. The connections Pin1 and Pin16 of the component BE are connected to a first and a second terminal of a balanced port of the first duplexer. The connections Pin13 and Pin14 are connected to a first and a second terminal of a balanced port of the second duplexer. The further connections Pin4, Pin5, Pin9 and Pin10 are each unbalanced.

The first and the second duplexer of the component BE each have two unbalanced connections and one balanced port. The unbalanced connections of the first duplexer correspond to the connections Pin4 and Pin10 of the component BE. The terminals of the balanced port of the first duplexer are connected to the connections Pin1, Pin16 of the component BE. The unbalanced connections of the second duplexer correspond to the connections Pin5 and Pin9 of the component BE. The terminals of the balanced port of the second duplexer are connected to the connections Pin13, Pin14 of the component BE.

A 90° hybrid HYB1, HYB2, HYB3, HYB4 splits an applied input signal into two output signals, wherein the two output signals have a relative phase shift of 90° with respect to one another. A 90° hybrid HYB1, HYB2, HYB3, HYB4 can operate either as adder or as divider.

A first 90° hybrid HYB1 is connected to the antenna connection ANT. In addition, two connections of the first 90° hybrid HYB1 are connected to two connections Pin4, Pin5 of the component BE, wherein the connection Pin4 is assigned to the first duplexer and the connection Pin5 is assigned to the second duplexer.

Correspondingly, a signal which is coupled in at the antenna connection ANT is split into two signals, which are phase shifted by 90° with respect to one another and which are output at in each case one connection Pin4, Pin5 of the component BE.

In addition, a second 90° hybrid HYB2 is connected to the transmission port TX and two connections of the second 90° hybrid HYB2 are connected to in each case two further connections Pin9, Pin10 of the component BE, wherein the connection Pin10 is assigned to the first duplexer and the connection Pin9 is assigned to the second duplexer.

A third 90° hybrid HYB3 is connected to a first port of the balanced output connection TX. In addition, the third 90° hybrid HYB3 is connected to two connections Pin1, Pin14 of the component BE, wherein one of these connections Pin1 is assigned to a first duplexer of the component BE and a second connection Pin14 is assigned to a second duplexer of the component BE.

A fourth 90° hybrid HYB4 is connected to a second port of the balanced output connection RX. In addition, the fourth 90° hybrid HYB4 is connected to two connections Pin13, Pin16 of the component BE. A connection of the fourth 90° hybrid HYB4 is connected to a connection Pin16 of the component BE, which is assigned to the first duplexer. A further connection of the fourth 90° hybrid HYB4 is connected to a connection Pin13 of the component BE, which is assigned to the second duplexer.

The first duplexer outputs one signal at each of the connections Pin1 and Pin16, wherein the two signals are phase-shifted through 90° with respect to one another. The signal output at the connection Pin1 has a phase shift $\Phi 1$ with respect to the input signal of the duplexer. The signal output the connection Pin16 has a phase shift $\Phi 2$ with respect to the input signal of the duplexer, wherein the difference between the two phase shifts $\Phi 1$ and $\Phi 2$ is 90°.

In addition, the second duplexer outputs one signal at each of the connections Pin13 and Pin14, wherein the two signals are phase-shifted through 90° with respect to one another. The signal output at the connection Pin14 has a phase shift $\Phi 1$ with respect to the input signal of the duplexer. The signal output at the connection Pin13 has a phase shift $\Phi 2$ with respect to the input signal of the duplexer.

In order that the signals coupled in at the antenna connection ANT interfere constructively at the reception connection RX of the module MO shown in FIG. 2, the third 90° hybrid HYB3 is connected to the two connections Pin1, Pin14 at which in each case the same phase shift $\Phi 1$ with respect to the input signal of the duplexer is present. In addition, the signals which are output at the two connections Pin16, Pin13 connected to the fourth 90° hybrid HYB4 likewise have the same phase shift $\Phi 2$. Correspondingly, in each case connections at which signals with the same phase shift $\Phi 1$, $\Phi 2$ are present are connected to the same 90° hybrids HYB3, HYB4.

As can be seen from FIG. 2, this interconnection of the 90° hybrids HYB1-HYB4 and the component BE results in only a single line crossover on the module MO.

In addition, the module can have elements for matching purposes. The module shown in FIG. 2 has, for this purpose, a first and a second inductance IND1, IND2, for example. The first inductance IND1 is connected to the two connections Pin1, Pin16 of the component BE. The second inductance IND2 is connected to the two connections Pin13, Pin14 of the component BE.

Further matching elements could be connected to the antenna connection ANT, for example. Complex inductances can be used as matching elements. In particular, resistors, coils, capacitors and lines can be used as matching elements.

The module MO is characterized by short line lengths, with the result that losses can be minimized. The layout also has a high degree of symmetry, which is decisive in particular for high-frequency applications.

FIG. 3 shows the module MO shown in FIG. 2, wherein the third and fourth 90° hybrids HYB3, HYB4 have been replaced by a so-called 2in1 hybrid 2in1HYB. A 2in1 hybrid 2in1HYB is a chip on which two 90° hybrids are arranged.

Two connections of the 2in1 hybrid are connected to the first and second ports of the balanced reception connection RX. In addition, four connections of the 2in1 hybrid 2in1HYB are connected to connections Pin1, Pin13, Pin14, Pin16 of the component BE. The combination comprising component BE and 2in1 hybrid 2in1HYB enables crossover-free and highly symmetrical line routing for the module MO.

The component BE and the 2in1 hybrid 2in1HYB are configured internally and interconnected to one another in such a way that connections of the component BE at which signals with the same phase shift $\Phi 1$, $\Phi 2$ are present are each connected to the same 90° hybrids of the 2in1 hybrid 2in1HYB.

Any manufacturing tolerances have the same effect on the two 90° hybrids HYB3, HYB4 combined to form the 2in1 hybrid 2in1HYB, with the result that the symmetry of the balanced reception connection RX is not obstructed. In comparison with the line routing shown in FIG. 2, a conductor track crossover in the case of a module MO as shown in FIG. 3 is avoided. The conductor track crossover now takes place within the 2in1 hybrid 2in1HYB.

The module MO shown in FIG. 3 also has, by way of example, two inductances IND1, IND2.

FIG. 4 shows an alternative configuration of the module MO. The duplexers of the component BE in this case have an unbalanced configuration with all connections. A third 90° hybrid HYB3 is connected to the two output connections Pin14, Pin16 of the component BE. The third 90° hybrid HYB3 is connected in series with a 180° hybrid BAL, wherein the 180° hybrid BAL splits an input signal into two output signals, wherein the output signals have a relative phase shift of 180° with respect to one another. This is therefore a balun.

This interconnection makes it possible to implement an enhanced duplexer with a balanced output connection RX, wherein the duplexers of the component BE each have unbalanced connections. This is advantageous in particular when the duplexers of the component BE are BAW duplexers.

FIG. 5 shows a modification of the module shown in FIG. 4. In this case, the third 90° hybrid and the 180° hybrid are arranged on a single chip CH.

FIG. 6 shows a 2in1 hybrid 2in1HYB, in which two 90° hybrids HYB1, HYB2 are arranged on a single chip. The 2in1 hybrid 2in1HYB has connections 1 to 8. The first 90° hybrid HYB1 is connected to the connections 1, 3 and 8. The second 90° hybrid HYB2 is connected to the connections 2, 4 and 5. In addition, both 90° hybrids are each connected to ground via a termination resistor TW1, TW2. The termination resistors TW1, TW2 are integrated in the 2in1 hybrid. The connections 6 and 7 of the 2in1 hybrid are grounded.

The conductor track which connects the first 90° hybrid HYB1 to the connection 3 crosses over the conductor track which connects the second 90° hybrid HYB2 to the connection 2. A short circuit is avoided by virtue of the fact that the conductor track crossover is implemented in different layers of a multilayered chip substrate.

FIG. 7 shows an implementation of the 2in1 hybrid 2in1HYB as an integrated passive component. The 2in1 hybrid 2in1HYB has a multilayered substrate. A 90° hybrid HYB1, HYB2 is in this case formed by two coil-shaped metallizations MET1, MET2, MET3, MET4, which are arranged in adjacent metal layers of the chip substrate. Each of the coil-shaped metallizations MET1-MET4 is connected to one of the connections 1-8 of the 2in1 hybrid 2in1HYB. In addition, two termination resistors TW1, TW2 are integrated.

FIG. 8 shows an implementation of the module MO. The component BE which has two duplexers is fitted on a module substrate SUB as an SMD component part. The 2in1 hybrid 2in1HYB is likewise fitted on the module substrate SUB as an integrated passive component part. In addition, the module MO has matching elements AS, in particular SMD matching coils. The matching elements AS can also be integrated in the integrated passive component part.

FIG. 9 shows an alternative implementation of the module MO. In this case, the integrated passive component part (the 2in1 hybrid 2in1HYB) is integrated in the module substrate SUB. The module MO has a multilayered substrate SUB, whose layers are connected to one another by through-vias DK. The advantage of this module MO is that the dimensions in terms of length and width can be reduced.

FIG. 10 shows a further implementation of the module MO. In this case, in addition to the embodiment shown in FIG. 9, an amplifier PA has been integrated in the module substrate SUB.

FIG. 11 shows a further implementation of the module MO, in which, in contrast to FIG. 10, the amplifier PA and the integrated passive component part are arranged as a discrete element under the matching elements AS and the component BE. An interconnection of the SMD component BE with the remaining elements and the PCB (printed circuit board) is performed by through-vias DK through the integrated passive component part. In addition, the matching elements AS could also be integrated in the integrated passive component part.

The 2in1 duplexers described here and the 2in1 hybrids 2in1HYB are not restricted to two duplexers or two hybrids. In the context of the invention, it is instead possible to arrange any desired number of duplexers in a single SMD housing or to connect any desired number of duplexers to form an Nin1 duplexer. The implementation shown in FIG. 5 of a 2in1 hybrid can be extended to any desired number of hybrids to form an Nin1 hybrid.

REFERENCE SYMBOLS

BE—Component
Pin1-Pin14—Connections of component
MF—Metal area
MO—Module
ANT—Antenna connection
TX—Transmission connection
RX—Reception connection
HYB1-HYB4—First to fourth 90° hybrid
2in1HYB—2in1 hybrid
BAL—180° hybrid
1-8—Connections of 2in1 hybrid
TW1, TW2—Termination resistor
AS—Matching element
DK—Through-via
PA—Amplifier
CH—Chip

What is claimed is:

1. A module comprising:
   a component comprising:
      a first duplexer operating with acoustic waves; and
      a second duplexer operating with acoustic waves,
         wherein the first and the second duplexer are arranged in a single SMD housing;
   an antenna connection;
   a transmission connection and a reception connection; and
   at least three 90° hybrids, which each split an input signal into two output signals,
   wherein the two output signals have a relative phase shift of 90° with respect to one another,
   wherein the antenna connection, the transmission connection and the reception connection are each connected to at least one 90° hybrid,
   wherein the component and the 90° hybrids are interconnected in such a way that the two output signals which are output by the 90° hybrid connected to the transmission connection interfere constructively at the antenna connection and parasitic signals caused by the two output signals interfere destructively at the reception connection,
   wherein at least two of the 90° hybrids are arranged on a single chip, and
   wherein the two 90° hybrids arranged on the chip are connected in parallel.

2. The module according to claim 1, wherein the 90° hybrids arranged on the chip are interconnected with connections of the chip in such a way that crossover-free conductor track routing is provided on the module.

3. The module according to claim 1, wherein the module also has a 180° hybrid, which splits an input signal into two output signals,
   wherein the two output signals have a relative phase shift of 180° with respect to one another, and
   wherein one of the 90° hybrids and the 180° hybrid are connected in series.

4. The module according to claim 3, wherein the 90° hybrid and the 180° hybrid connected in series therewith are arranged on a single chip.

5. The module according to claim 1, wherein each of the 90° hybrids is implemented by a multilayered substrate, which has two coil-shaped metallizations in two layers of the substrate.

6. The module according to claim 1, wherein a termination resistor is integrated in each 90° hybrid.

7. The module according to claim 1, wherein signals with a first phase angle are output at two connections of the component, and signals with a second phase angle are output at two connections of the component, and
   wherein those connections of the component at which the signals with the first phase angle are present are connected to one of the 90° hybrids and those connections of the component at which the signals with the second phase angle are present are connected to another of the 90° hybrids.

8. A chip comprising:
   a first 90° hybrid, which splits a first input signal into two output signals, wherein the two output signals have a relative phase shift of 90° with respect to one another; and
   a second 90° hybrid, wherein the first 90° hybrid and the second 90° hybrid are connected in parallel.

9. The chip according to claim 8, wherein the chip has a multilayered chip substrate and connections, and
   wherein the first and the second 90° hybrid are implemented by two coil-shaped metallizations in two layers of the multilayered chip substrate, and
   wherein the coil-shaped metallizations are each connected via a connecting metallization to in each case one connection, and
   wherein a connecting metallization of the first 90° hybrid and a connecting metallization of the second 90° hybrid cross over in different layers.

10. A module comprising:
    a component comprising:
       a first duplexer operating with acoustic waves; and
       a second duplexer operating with acoustic waves,
          wherein the first and the second duplexer are arranged in a single SMD housing;
    an antenna connection;
    a transmission connection and a reception connection; and
    at least three 90° hybrids, which each split an input signal into two output signals,
    wherein the two output signals have a relative phase shift of 90° with respect to one another,
    wherein the antenna connection, the transmission connection and the reception connection are each connected to at least one 90° hybrid,
    wherein the component and the 90° hybrids are interconnected in such a way that the two output signals which are output by the 90° hybrid connected to the transmission connection interfere constructively at the antenna connection and parasitic signals caused by the two output signals interfere destructively at the reception connection,
    wherein the module also has 180° hybrid, which splits an input signal into two output signals,
    wherein the two output signals have a relative phase shift of 180° with respect to one another, and
    wherein one of the 90° hybrids and the 180° hybrid are connected in series.

11. A module comprising:
    a component comprising:
       a first duplexer operating with acoustic waves; and
       a second duplexer operating with acoustic waves,
          wherein the first and the second duplexer are arranged in a single SMD housing;
    an antenna connection;
    a transmission connection and a reception connection; and
    at least three 90° hybrids, which each split an input signal into two output signals,
    wherein the two output signals have a relative phase shift of 90° with respect to one another,
    wherein the antenna connection, the transmission connection and the reception connection are each connected to at least one 90° hybrid,
    wherein the component and the 90° hybrids are interconnected in such a way that the two output signals which are output by the 90° hybrid connected to the transmission connection interfere constructively at the antenna connection and parasitic signals caused by the two output signals interference destructively at the reception connection,
    wherein signals with a first phase angle are output at two connections of the component, and signals with a second phase angle are output at two connections of the component, and
    wherein those connections of the component at which the signals with the first phase angle are present are connected to one of the 90° hybrids and those connection of the component at which the signals with the second phase angle are present are connected to another of the 90° hybrids.

12. A chip comprising:
a first 90° hybrid, which splits a first input signal into two output signals, wherein the two output signals have a relative phase shift of 90° with respect to one another, and
a second 90° hybrid,
wherein the chip has a multilayered chip substrate and connections,
wherein the first and second 90° hybrid are implemented by two coil-shaped metallizations in two layers of the multilayered chip substrate, and in which the coil-shaped metallization are each connected via a connecting metallization to in each case one connection, and
wherein a connecting metallization of the first 90° hybrid and a connecting metallization of the second 90° hybrid cross over in different layers.

13. A chip comprising:
a first 90° hybrid, which splits a first input signal into two output signals, wherein the two output signals have a relative phase shift of 90° with respect to one another, and
a 180° hybrid, which splits a second signal into two output signals, wherein the two output signals have a relative phase shift of 180° with respect to one another,
wherein the chip has a multilayered chip substrate and connections, and
wherein the first 90° hybrid and the 180° hybrid are connected in series.

* * * * *